United States Patent
Huang et al.

(10) Patent No.: US 10,128,982 B2
(45) Date of Patent: Nov. 13, 2018

(54) EXTENDED POLAR CODES

(71) Applicant: MACRONIX INTERNATIONAL CO., LTD., Hsinchu (TW)

(72) Inventors: Yu-Ming Huang, Taipei (TW); Hsiang-Pang Li, Zhubei (TW); Hsie-Chia Chang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 82 days.

(21) Appl. No.: 15/287,120

(22) Filed: Oct. 6, 2016

(65) Prior Publication Data

US 2017/0222757 A1 Aug. 3, 2017

Related U.S. Application Data

(60) Provisional application No. 62/290,597, filed on Feb. 3, 2016.

(51) Int. Cl.
*H03M 13/00* (2006.01)
*H04L 1/00* (2006.01)
*H03M 13/13* (2006.01)

(52) U.S. Cl.
CPC .......... *H04L 1/0058* (2013.01); *H03M 13/13* (2013.01); *H03M 13/616* (2013.01); *H03M 13/618* (2013.01); *H04L 1/0041* (2013.01)

(58) Field of Classification Search
CPC .. H04L 1/0058; H04L 1/0041; H03M 13/618; H03M 13/616; H03M 13/13
See application file for complete search history.

(56) References Cited

U.S. PATENT DOCUMENTS

| | | | | |
|---|---|---|---|---|
| 9,628,114 B2 * | 4/2017 | Huang | ............... | H03M 13/616 |
| 2015/0091742 A1 * | 4/2015 | Ionita | ..................... | H03M 5/18 341/57 |
| 2015/0194987 A1 * | 7/2015 | Li | ......................... | H04L 1/0057 714/752 |
| 2015/0333775 A1 * | 11/2015 | Korb | .................... | H03M 13/45 714/780 |

\* cited by examiner

*Primary Examiner* — Guy Lamarre
(74) *Attorney, Agent, or Firm* — Finnegan, Henderson, Farabow, Garrett & Dunner LLP

(57) ABSTRACT

A method for increasing coding reliability includes generating a generator matrix for an extended polar code including a standard polar code part and an additional frozen part. The standard polar code part has N bit-channels, including K information bit-channels and N−K frozen bit-channels. The additional frozen part has q additional frozen bit-channels. Among the K information bit-channels, q information bit-channels are re-polarized using the q additional frozen bit-channels. The method further includes receiving an input vector including K information bits and N+q−K frozen bits, and transforming, using the generator matrix, the input vector to an output vector including N+q encoded bits. The K information bits are allocated to the K information bit-channels, and the N+q−K frozen bits are allocated to the N−K frozen bit-channels and the q additional frozen bit-channels.

11 Claims, 5 Drawing Sheets

EXTENDED POLAR CODES

CROSS-REFERENCE TO RELATED APPLICATIONS

This application is based upon and claims the benefit of priority from Provisional Application No. 62/290,597, filed on Feb. 3, 2016, the entire contents of which are incorporated herein by reference.

TECHNOLOGY FIELD

The disclosure relates to an error correcting method and device and, more particularly, to a method and device for increasing coding reliability by employing an extended polar code.

BACKGROUND

In the information transmission and processing area, multiple communication channels may be used to transmit a piece of information. The communication channels are often noisy and have a probability of incorrectly transmitting a data bit, such a probability being referred to as a "probability of error." That is, with an input of binary data 1, a communication channel may output an erroneous binary data 0, and vice versa. Similarly, in the data storage area, multiple storage cells are used to store data. Due to noise or external disturbance, a data bit stored in a storage cell may be changed, so that the data bit read from the storage cell is not the same as the data bit written into the storage cell. The probability that the stored data bit is changed is also referred to as a "probability of error."

To reduce error in the transmission or storage of information/data, and thereby reduce the probability of error, the information/data to be transmitted or stored is usually encoded by an error correcting method before being transmitted. Hereinafter, both information/data transmission and storage are collectively referred to as information transmission to simplify description. Thus, unless otherwise specified, "information transmission," "transmitting information," or similar phrases should be understood to mean "information/data transmission and/or storage," "transmitting and/or storing information/data," etc. Further, information to be transmitted is also referred to as "information" to simplify description, unless otherwise specified. As an example of coding information, bits of the information and several frozen bits are encoded to form encoded bits, which are then transmitted through communication channels or stored in storage cells. Such coding can be considered as a transformation of an input vector, which consists of the bits of the information and the frozen bits, by a generator matrix to an output vector, which consists of the encoded bits to be transmitted through the communication channels or stored in storage cells. Each input bit corresponds to a bit-channel of such transformation, and each bit-channel has a corresponding probability of error.

Polar coding is a type of linear block error correcting coding method that can "redistribute" the probability of error among the bit-channels. After polar coding, some bit-channels have a lower probability of error than other bit-channels. The bit-channels having a lower probability of error are then used to transmit the information, while other bit-channels are "frozen," i.e., used to transmit the frozen bits. Since both the sender side and the receiver side know which bit-channels are frozen, arbitrary data can be allocated to the frozen bit-channels. For example, a binary data 0 is allocated to each of the frozen bit-channels.

However, the construction of polar codes (the codes for polar coding) imposes certain restrictions on the code length of a conventional polar code. In the present disclosure, the conventional polar code is also referred to as a "standard polar code." Correspondingly a polar coding scheme using a conventional polar code is also referred to as a "conventional polar coding scheme" or a "standard polar coding scheme." More particularly, the conventional polar coding scheme limits the code length to a power of 2, i.e., $2^n$, where n is a positive integer. This introduces an additional complexity into a system employing polar coding. One solution to this problem is dividing information being encoded into segments having an appropriate length to fit the coding scheme, to create length-compatible polar codes.

Exemplary approaches to creating length-compatible polar codes include, for example, puncturing and shortening. Both approaches achieve an arbitrary code length by cutting code length from an original length of $2^n$ so that some bits are not transmitted. However, as the code length is shortened from a length of $2^n$, an error-correcting performance loss as measured by, e.g., bit error rate, BER, or frame error rate, FER, of the code increases. FIG. 1 schematically shows the relationship between the code length of a code and the performance loss of the code in the puncturing or the shortening approach. In FIG. 1, a higher degree of gray indicates a more severe performance loss. As shown in FIG. 1, when the code length equals a power of 2, there is no performance loss. When the code length decreases from a power of 2, the performance loss increases.

However, such exemplary approaches are not suitable for application in certain scenarios, such as data storage in a memory device. This is because, for example, in a memory device, data is usually stored in units each having a size that is a multiple of 8, such as 1024, and adding a small number of frozen bits to each block coding makes the code length slightly larger than $2^n$. In this scenario, the puncturing or the shortening approach will result in a severe performance loss as shown in FIG. 1.

SUMMARY

In accordance with the disclosure, there is provided a method for increasing coding reliability. The method includes generating a generator matrix for an extended polar code including a standard polar code part and an additional frozen part. The standard polar code part has N bit-channels, including K information bit-channels and N−K frozen bit-channels, where N equals $2^n$, n is a positive integer, and K is a positive integer equal to or smaller than N. The standard polar code part includes $2^{m-1}$ mother codes, where m is an integer larger than 1. The additional frozen part has q additional frozen bit-channels, where q is a positive integer. Among the K information bit-channels, q information bit-channels are subject to an m-stage re-polarization using the q additional frozen bit-channels. The method further includes receiving an input vector including K information bits and N+q−K frozen bits, and transforming, using the generator matrix, the input vector to an output vector including N+q encoded bits. The K information bits are allocated to the K information bit-channels, and the N+q−K frozen bits are allocated to the N−K frozen bit-channels and the q additional frozen bit-channels.

Also in accordance with the disclosure, there is provided a device for increasing coding reliability. The device includes a processor and a non-transitory computer-readable storage medium storing instructions. The instructions, when executed by the processor, cause the processor to generate a generator matrix for an extended polar code including a standard polar code part and an additional frozen part. The standard polar code part has N bit-channels, including K information bit-channels and N−K frozen bit-channels, where N equals $2^n$, n is a positive integer, and K is a positive integer equal to or smaller than N. The standard polar code part includes $2^{m-1}$ mother codes, where m is an integer larger than 1. The additional frozen part has q additional frozen bit-channels, where q is a positive integer. Among the K information bit-channels, q information bit-channels are subject to an m-stage re-polarization using the q additional frozen bit-channels. The instructions further cause the processor to receive an input vector including K information bits and N+q−K frozen bits, and transform, using the generator matrix, the input vector to an output vector including N+q encoded bits. The K information bits are allocated to the K information bit-channels, and the N+q−K frozen bits are allocated to the N−K frozen bit-channels and the q additional frozen bit-channels.

Features and advantages consistent with the disclosure will be set forth in part in the description which follows, and in part will be obvious from the description, or may be learned by practice of the disclosure. Such features and advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

Embodiments consistent with the disclosure include a method and device for increasing coding reliability by extending a polar code.

Hereinafter, embodiments consistent with the disclosure will be described with reference to the drawings. Wherever possible, the same reference numbers will be used throughout the drawings to refer to the same or like parts.

A conventional polar code can be expressed as an (N, K) polar code, also referred to as an (N, K) standard polar code, where N represents a codeword length, i.e., a total number of bit-channels, of the standard polar code, which equals $2^n$, where n is a positive integer, and K is an integer not larger than N and represents an information length of a piece of information being transmitted. Thus, using the standard polar code, the K bits of information are each allocated to one of K bit-channels that have a lower probability of error than other bit-channels. The remainder of the N bit-channels, i.e., the remaining N−K bit-channels, are frozen. The bit-channels that are used to transmit the information are referred to herein as "non-frozen bit-channels."

According to the present disclosure, q least reliable non-frozen bit-channels are "re-polarized" to enhance their reliability, where q is an integer not larger than K. That is, these q non-frozen bit-channels do not only undergo a standard polarizing process, but also undergo an additional polarizing process. To re-polarize the q non-frozen bit-channels, an additional q frozen bit-channels are used. That is, to re-polarize the q non-frozen bit-channels, the (N, K) standard polar code is extended to an (N+q, K) extended polar code. By choosing the value of q, a code length of the extended polar code can be adjusted, thus making it length-compatible. In some embodiments, q can be chosen based on experience. For example, N=1024 and q=114 may be chosen to encode K=800 bits of data.

Figure 2:
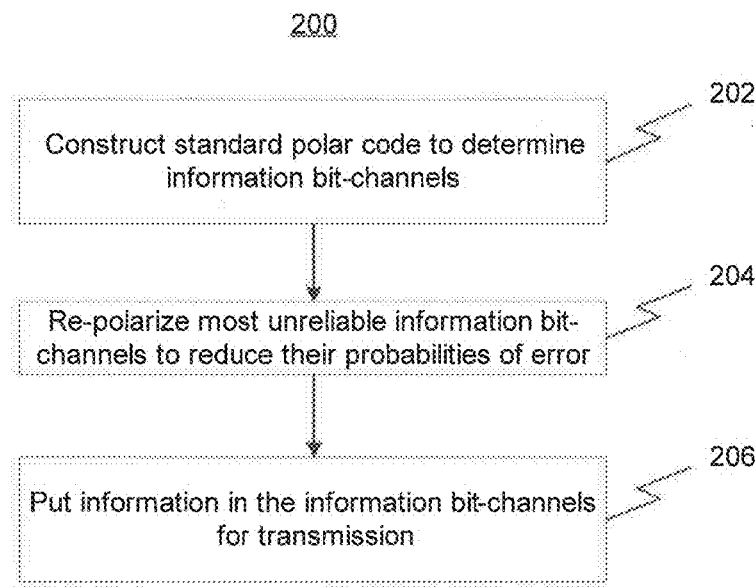
FIG. 2 is a flowchart showing a method of extended polar coding according to an exemplary embodiment.

FIG. 2 shows an exemplary method 200 for encoding a piece of information using an extended polar coding scheme consistent with embodiments of the present disclosure. The method 200 can be implemented in, for example, a memory device, such as a single-level cell memory device or a multi-level cell memory device, or a communication device. According to the method 200, an (N, K) standard polar code is extended to an (N+q, K) extended polar code with q additional frozen bit-channels, for transmitting K bits of information. Consistent with embodiments of the present disclosure, q may be much smaller than N. For example, q is smaller than one half of N. As another example, q is smaller than one third of N.

As shown in FIG. 2, at 202, the standard polar code is constructed to determine K optimal bit-channels. Various types of construction can be used, such as construction by mutual information, Bhattacharyya parameter, or probability of error. For example, in the code construction using the probability of error, after the code construction, the bit-channels may have different probabilities of error. Thus, K bit-channels that have probabilities of error smaller than those of the other N−K bit-channels are selected as the optimal bit-channels. These optimal bit-channels will be used to transmit information, and are thus also referred to as information bit-channels.

According to the present disclosure, the respective probabilities of error of the K information bit-channels may also be different from each other. A bit-channel is more unreliable when it has a larger probability of error. At 204, q least reliable information bit-channels are re-polarized to reduce their probabilities of error, by executing an additional channel polarization on the q least reliable information bit-channels using the q additional frozen bit-channels.

At 206, information is allocated to the K information bit-channels, including the q re-polarized information bit-channels, for transmission. The other N+q−K bit-channels are frozen, i.e., a binary data 0 is allocated to each of the N+q−K frozen bit-channels.

Figure 3:
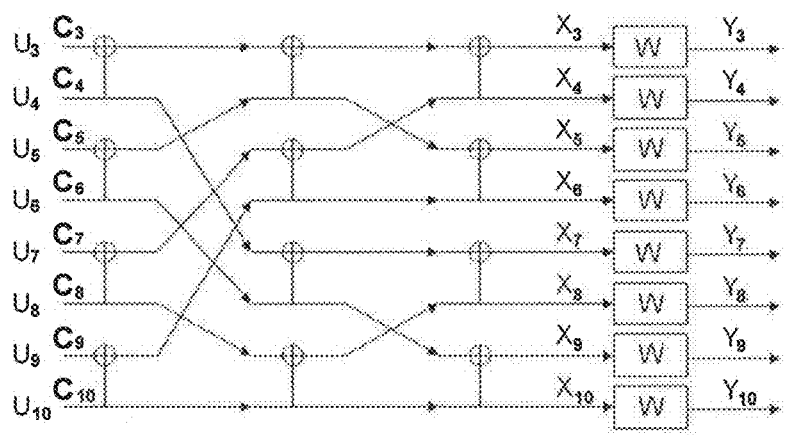
FIG. 3 schematically shows an encoding architecture of an exemplary standard polar coding scheme.

An example is described below for explaining the extended coding scheme consistent with embodiments of the present disclosure. FIG. 3 schematically shows an encoding architecture (a visual representation of the generator matrix) of an (8, 5) standard polar coding scheme, which includes eight bit-channels ($C_3$, $C_4$, ... $C_{10}$) for transmitting five information bits and three frozen bits, collectively referred to herein as "input bits ($U_3$, $U_4$, ... $U_{10}$)," where each input bit $U_i$ is allocated to a corresponding bit-channel $C_i$, i=3, 4, ... 10. This encoding architecture is obtained by construction of an (8, 5) standard polar code. As shown in FIG. 3, the eight bits are allocated to the eight bit-channels and encoded to form encoded bits $X_3$, $X_4$, ... $X_{10}$. The encoded bits are then transmitted through communication channels W (in the scenario of information transmission) or stored in storage cells W (in the scenario of data storage). The receiver side receives the transmitted bits $Y_3$, $Y_4$, ... $Y_{10}$ (in the scenario of information transmission) or reads the stored bits $Y_3$, $Y_4$, ... $Y_{10}$ (in the scenario of data storage). In this example, bit-channels $C_6$-$C_{10}$ are more reliable than bit-channels $C_3$-$C_5$. Therefore, bit-channels $C_6$-$C_{10}$ are used to transmit the five information bits and bit-channels $C_3$-$C_4$ are used to transmit the three frozen bits.

Figure 4:
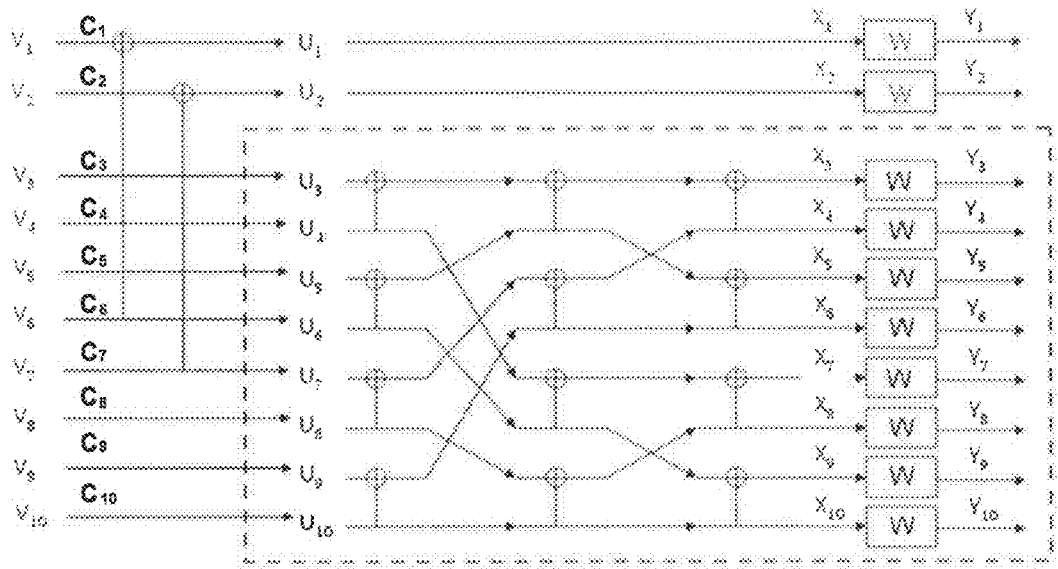
FIG. 4 schematically shows an encoding architecture of an extended polar coding scheme according to an exemplary embodiment.

Further, among bit-channels $C_6$-$C_{10}$, bit-channels $C_6$ and $C_7$ are less reliable than the other bit-channels, and are subject to an additional channel polarization using two additional frozen channels, consistent with the present disclosure. The additional channel polarization extends the (8, 5) standard polar code to a (10, 5) extended polar code. The encoding architecture of the (10, 5) extended polar code is shown in FIG. 4, which includes a standard polar coding part enclosed by the dashed frame in FIG. 4 and an extended polar coding part outside the dashed frame. This exemplary scheme includes ten bit-channels $C_1$, $C_2$, ... $C_{10}$, each of which is initially allocated a corresponding one of ten input bits $V_1$, $V_2$, ... $V_{10}$.

As shown in FIG. 4, with the (10, 5) extended polar code, five information bits $V_6$-$V_{10}$ are allocated to bit-channels $C_6$-$C_{10}$ (the information bit-channels) and five frozen bits $V_1$-$V_5$ are allocated to bit-channels $C_1$-$C_5$ (the frozen bit-channels). The input bits $V_3$, $V_4$, $V_5$, $V_8$, $V_9$, and $V_{10}$ pass directly to bits $U_3$, $U_4$, $U_5$, $U_8$, $U_9$, and $U_{10}$ without change, while the input bits $V_6$ and $V_7$ are polarized with the input bits $V_1$ and $V_2$, resulting in bits $U_6$, $U_7$, $U_1$, and $U_2$. The bits $U_1$ and $U_2$ become encoded bits $X_1$ and $X_2$ in the output vector without change. The other bits $U_3$-$U_{10}$ are further encoded by the standard polar coding part and become encoded bits $X_3$-$X_{10}$ in the output vector. The encoded bits are then transmitted through communication channels W (in the scenario of information transmission) or stored in storage cells W (in the scenario of data storage). The receiver side receives the transmitted bits $Y_1$-$Y_{10}$ (in the scenario of information transmission) or reads the stored bits $Y_1$-$Y_{10}$ (in the scenario of data storage).

Figure 5:
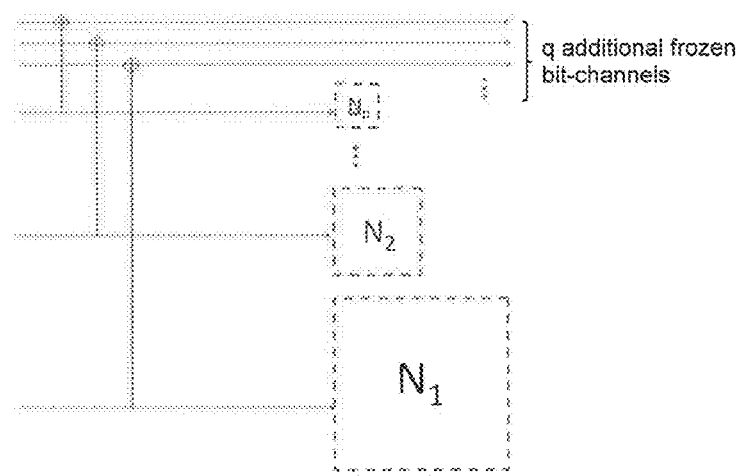
FIG. 5 schematically shows a modified extended polar coding scheme according to an exemplary embodiment.

FIG. 5 schematically shows another extended polar coding scheme consistent with embodiments of the present disclosure. Hereinafter, the extended polar coding shown in FIG. 5 is also referred to as a "modified extended polar coding." The modified extended polar coding re-polarizes several standard polar codes at the same time, and thus increases flexibility. Moreover, the modified extended polar coding can further improve the error correction performance.

As shown in FIG. 5, p standard polar codes are re-polarized together using q additional frozen bit-channels. In the p standard polar codes, the j-th standard polar code has a number of bits of $N_j$, where j is a positive integer and 1≤j≤p. Among the $N_j$ bits of the j-th standard polar code, $K_j$ bits are information bits, where $K_j \le N_j$. According to the modified extended polar coding, the p standard polar codes are separately constructed to obtain the probability of error of each information bit-channel, and then the q least reliable information bit-channels among all information bit-channels in the p standard polar codes are re-polarized using the q additional frozen bit-channels. In FIG. 5, each standard polar code is shown to be associated with one of the additional frozen bit-channels. This is merely for illustrative purposes, and does not indicate each standard polar code is re-polarized using one additional frozen bit-channel. According to the modified extended polar coding, it may be possible that some standard polar codes are re-polarized but some are not. In addition, the number of additional frozen bit-channels does not necessarily equal to the number of standard polar code used in the modified extended polar coding.

According to the present disclosure, in the modified extended polar coding, different numbers of standard polar codes and/or of additional frozen channels can be used to achieve the encoding of the same number of information bits using the same number of total bits. The sizes of different standard polar codes can be the same as or different from each other. For example, to create a (1138, 800) code, two standard polar codes may be used, with $N_1$=1024 and $N_2$=64, and the remaining 50 bits (=1138−$N_1$−$N_2$) being additional frozen bits for re-polarization. Alternatively, three standard polar codes may be used, with $N_1$=512, $N_2$=512, and $N_3$=64, and the remaining 50 bits being additional frozen bits for re-polarization. As another example, four standard polar codes may be used, with $N_1$=1024, $N_2$=64, $N_3$=32, and $N_4$=16, and the remaining 2 bits being additional frozen bits for re-polarization. Since different numbers of standard polar codes can be chosen for the same code length and code rate, the modified extended polar coding has an increased flexibility.

In the exemplary methods described above with reference to FIGS. 2-4, the entire (N, K) standard polar code is considered and processed as a whole. Further, each of the q least reliable information bit-channels in the (N, K) standard polar code is re-polarized using one of the additional q frozen channels. In the present disclosure, the re-polarization of one information bit-channel using one corresponding frozen channel is also referred to as a "one-stage re-polarization" or "single-stage re-polarization."

In some embodiments, to increase the throughput of the polarizing process, the (N, K) standard polar code, where N=$2^n$, can be separated into s=$2^{m-1}$ mother codes each having a shorter code length, and the s mother codes can be processed separately. Here, m is an integer larger than 1 and can be, for example, 2 or 3. Each of the mother codes can be considered as a standard polar code with a shorter code length. However, since reducing the code length increases the error-correcting performance loss, a multi-stage, e.g., m-stage, re-polarization, is adopted to reduce the error-correcting performance loss, as described below.

Figure 6:
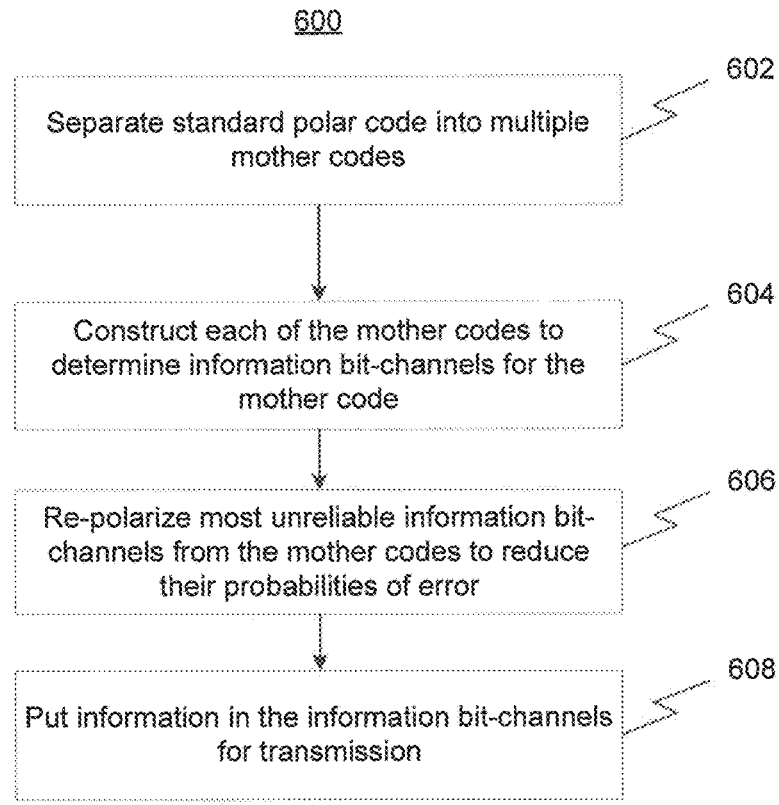
FIG. 6 is a flowchart showing a method of extended polar coding according to another exemplary embodiment.

FIG. 6 shows another exemplary method 600 for encoding a piece of information using a multi-stage extended polar coding scheme consistent with embodiments of the present disclosure. The method 600 can be implemented in, for example, a memory device, such as a single-level cell memory device or a multi-level cell memory device, or a communication device. According to the method 600, an (N, K) standard polar code is separated into $s=2^{m-1}$ mother codes, each of which has a codeword length of $N_r$ and an information length of $K_r$, where r is a positive integer and $1 \leq r \leq s$, $N=N_1+ \ldots +N_s$, and $K=K_1+ \ldots +K_s$. In some embodiments, all $N_r$ are equal to each other, i.e., $N_r=N/s=2^{n-m+1}$. In the present disclosure, $K_r$ can be the same as or different from each other. In some embodiments, $K_r$ is chosen so that the s mother codes include the same or about the same number of information bits. The s mother codes are separately constructed to obtain the probability of error of each information bit-channel, and then $q_r$ least reliable information bit-channels among the $K_r$ information bit-channels in the r-th mother code are selected for re-polarization, where $q_r$ is a positive integer smaller than $K_r$. $q_r$ can be the same as or different from each other. In some embodiments, $q_r$ is chosen so that the s mother codes include the same or about the same number of information bit-channels to be re-polarized. More specifically, a total of q $(=q_1+ \ldots +q_s)$ selected information bit-channels are subjected to the m-stage re-polarization using q additional frozen bit-channels. Since at least one information bit-channel is selected from each mother code for re-polarization, q equals or is larger than s $(=2^{m-1})$. The extended polar-coding scheme described above with reference to FIGS. 2-4 can be considered as a special case of m=1, and can also be referred to as a one-stage or single-stage extended polar coding scheme.

As shown in FIG. 6, at 602, the (N, K) standard polar code is separated into s mother codes. Each of the mother codes includes $N_r$ bits to code $K_r$ information bits. At 604, each of the m mother codes is constructed to determine $K_r$ optimal bit-channels, i.e., $K_r$ information bit-channels, according to a construction method similar to those described above with reference to FIG. 2. At 606, $q_r$ least reliable information bit-channels, i.e., $q_r$ information bit-channels having the highest probabilities of error among the $K_r$ information bit-channels after the construction, of the r-th mother code are selected, and all of the q $(=q_1+ \ldots +q_s)$ selected information bit-channels are re-polarized to reduce their probabilities of error, by executing an additional m-stage channel polarization on the q selected information bit-channels using q additional frozen bit-channels. At 608, information is allocated to the K information bit-channels, including the q re-polarized information bit-channels, for transmission. The other N+q−K bit-channels are frozen, i.e., a binary data 0 is allocated to each of the N+q−K frozen bit-channels.

Figure 7:
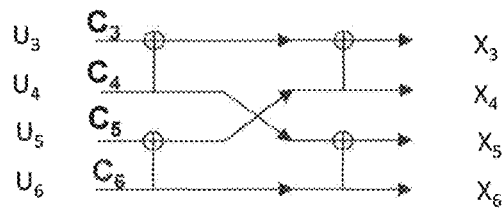
FIG. 7 schematically shows encoding architectures of exemplary mother codes.
Figure 7:
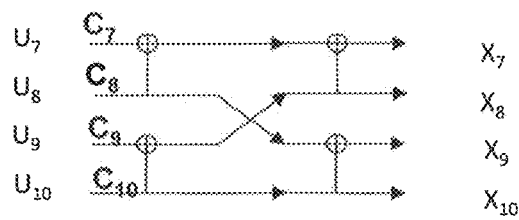

An example is described below for explaining the multi-stage extended polar coding scheme consistent with embodiments of the present disclosure. The example described below also uses the (8, 5) standard polar code for illustration. In this example, the (8, 5) standard polar code is separated into two mother codes, i.e., a (4, 2) mother code and a (4, 3) mother code. FIG. 7 schematically shows the encoding architecture of the (4, 2) mother code, which includes four bit-channels $C_3$, $C_4$, $C_5$, and $C_6$ for transmitting four input bits $U_3$, $U_4$, $U_5$, and $U_6$, and the encoding architecture of the (4, 3) mother code, which includes four bit-channels $C_7$, $C_8$, $C_9$, and $C_{10}$ for transmitting four input bits $U_7$, $U_8$, $U_9$, and $U_{10}$. Each input bit $U_i$ is allocated to a corresponding bit-channel $C_i$, i=3, 4, . . . 10. The encoding architectures shown in FIG. 7 are obtained by construction of the (4, 2) mother code and the (4, 3) mother code, respectively. As shown in FIG. 7, the eight bits are allocated to the eight bit-channels and encoded to form encoded bits $X_3$, $X_4$, . . . $X_{10}$.

Figure 8:
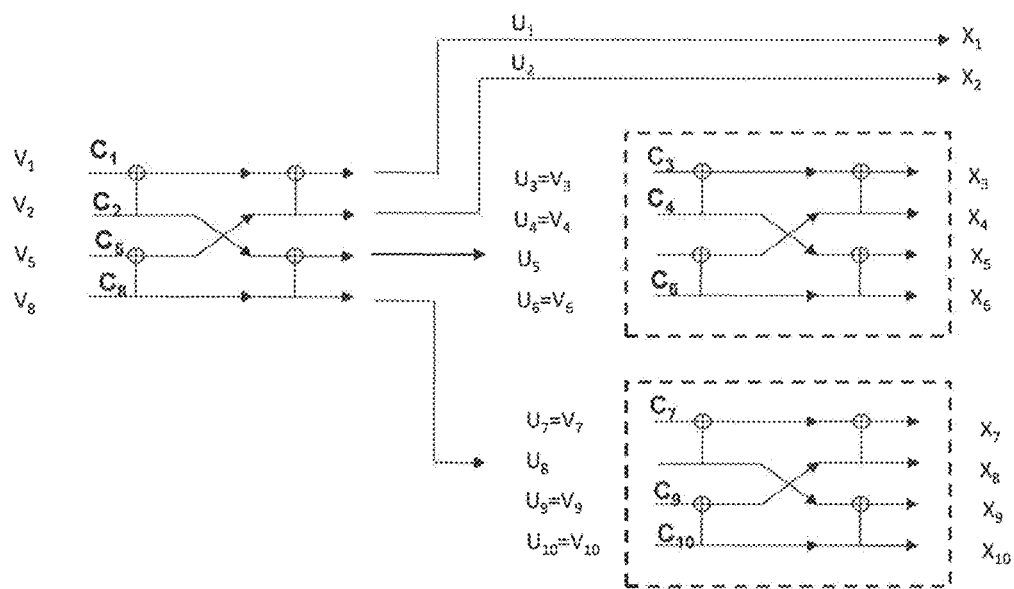
FIG. 8 schematically shows an encoding architecture of a 2-stage extended polar coding scheme according to an exemplary embodiment.

The 2-stage re-polarization extends the (8, 5) standard polar code to a (10, 5) extended polar code. The encoding architecture of the (10, 5) extended polar code is shown in FIG. 8, which includes two mother polar coding parts enclosed by the dashed frames in FIG. 8 and a 2-stage extended polar coding part outside the dashed frames. This exemplary scheme includes ten bit-channels $C_1, C_2, \ldots C_{10}$, each of which is initially allocated a corresponding one of ten input bits $V_1, V_2, \ldots V_{10}$.

As shown in FIG. 8, with the (10, 5) extended polar code, five information bits $V_5$, $V_6$, $V_8$, $V_9$, and $V_{10}$ are allocated to bit-channels $C_5$, $C_6$, $C_8$, $C_9$, and $C_{10}$ (the information bit-channels) and five frozen bits $V_1$, $V_2$, $V_3$, $V_4$, and $V_7$ are allocated to bit-channels $C_1$, $C_2$, $C_3$, $C_4$, and $C_7$ (the frozen bit-channels). The input bits $V_3$, $V_4$, $V_6$, $V_7$, $V_9$, and $V_{10}$ pass directly to bits $U_3$, $U_4$, $U_6$, $U_7$, $U_9$, and $U_{10}$ without change, while the input bits $V_5$ and $V_8$ are subjected to the 2-stage re-polarization with the input bits $V_1$ and $V_2$, resulting in bits $U_5$, $U_8$, $U_1$, and $U_2$. The bits $U_1$ and $U_2$ become encoded bits $X_1$ and $X_2$ in the output vector without change. The other bits $U_3$-$U_{10}$ are further separately encoded by the two mother polar coding parts and become encoded bits $X_3$-$X_{10}$ in the output vector.

According to the present disclosure, although the exemplary multi-stage extended polar coding scheme and the exemplary single-stage extended polar coding scheme use the same number of bit-channels, including the same number of additional frozen bit-channels and the same number of information bit-channels, the probabilities of error of the channels after the construction and after the re-polarization are different in these two examples, and the channels being re-polarized are also different. Further, as described above, using the multi-stage extended polar coding scheme, decoding operations can be conducted in parallel for different mother codes, and thus throughput can be improved as compared to the single-stage extended polar coding scheme. For example, for an N-bit ($N=2^n$) standard polar code, a throughput gain of an m-stage extended polar coding scheme is roughly $(n/(n-m+1))2^{m-1}$ times that of a single-stage extended polar coding scheme.

In the above-described exemplary multi-stage extended polar coding scheme, each of the mother codes is separately considered for input bit allocation, i.e., the probability of error of a bit-channel is only compared with the probabilities of error of other bit-channels of the same mother code to determine whether the bit-channel should be an information bit-channel and whether the bit-channel should be re-polarized. In some embodiments, all mother codes are considered together for input bit allocation. That is, although the mother codes are separately constructed to determine the probabilities of error of the bit-channels, a bit-channel is compared with all other bit-channels, both in the same mother code and in other mother code(s), to determine whether the bit-channel should be an information bit-channel and whether the bit-channel should be subject to the multi-stage re-polarization. This modified coding scheme is also referred to as a "modified multi-stage extended polar coding scheme." According to the modified multi-stage extended polar coding scheme, a mother code may or may not contain information bit-channels, frozen bit-channels, or information bit-channels to be re-polarized. Further, the total number of information bit-channels to be re-polarized does not need to be equal to or larger than the number of mother codes, i.e., the value of q can be smaller than the value of $2^{m-1}$.

For example, also referring to FIG. 8, according to the modified multi-stage extended polar coding scheme, bit-channels $C_3$-$C_{10}$ are compared with each other after the two mother codes are constructed. Bit-channels $C_5$, $C_6$, $C_8$, $C_9$, and $C_{10}$ are determined to be more reliable than bit-channels $C_3$, $C_4$, $C_7$, and are thus used as the information bit-channels. Further, among the five determined information bit-channels, bit-channels $C_5$ and $C_8$ are less reliable, and are subject to the 2-stage re-polarization.

The modified multi-stage extended polar coding scheme is similar to the modified extended polar coding scheme described above with reference to FIG. 5, except that in the modified extended polar coding scheme, the q less reliable information bit-channels are subject to a one-stage repolarization, while in the modified multi-stage extended polar coding scheme, the q least reliable information bit-channels are subject to a multi-stage repolarization.

According to the present disclosure, a generator matrix for the extended polar coding, also referred to as an "extended generator matrix," is produced by re-polarizing q information bit-channels among K information bit-channels of N bit-channels. The K information bit-channels and how unreliable each information bit-channel is (represented by the probability of error of that information bit-channel) are determined by constructing one or more mother codes of the standard polar code that includes the N bit-channels. The extended generator matrix is then used to transform an input vector consisting of K bits of information and N+q–K frozen bits into an output vector consisting of N+q encoded bits, where the K bits of information are allocated to the K information bit-channels of the extended generator matrix and the N+q–K frozen bits are allocated to the N+q–K frozen bit-channels.

Compared to a conventional polar coding scheme, the extended polar coding scheme consistent with the present disclosure provides a better flexibility in terms of code length, which facilitates system management. Compared to other length-compatible polar coding schemes, such as shortened polar coding schemes, the extended polar coding scheme consistent with the present disclosure has less reliability performance loss. That is, the extended polar coding scheme consistent with the present disclosure provides better flexibility the conventional polar coding scheme.

Figure 1:
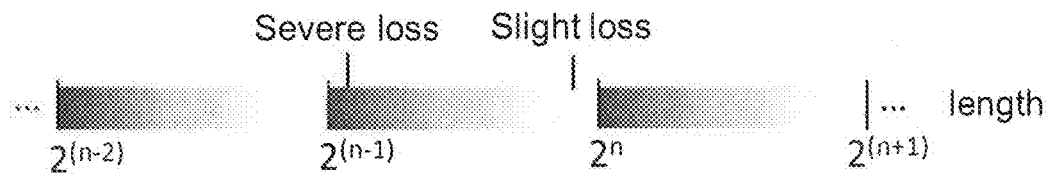
FIG. 1 schematically shows a relationship between a length of a code and a performance loss of the code in exemplary approaches such as puncturing and shortening.
Figure 9:
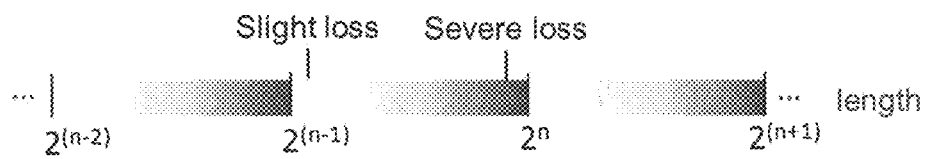
FIG. 9 schematically shows a relationship between a length of an extended polar code according to an exemplary embodiment and a performance loss of the code.

FIG. 9 schematically shows the relationship between the code length of an extended polar code and the performance loss of the code. As shown in FIGS. 1 and 9, the trend of performance loss of the extended polar code is inverse as compared to that of a punctured or shortened polar code.

Figure 10:
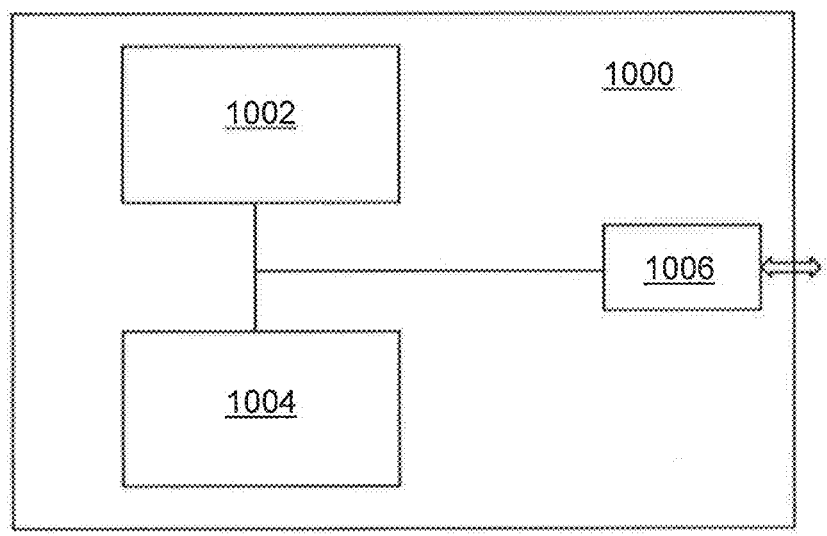
FIG. 10 is a block diagram schematically showing a device for extended polar coding according to an exemplary embodiment.

Embodiments of the present disclosure also include a hardware device programmed to execute methods consistent with the present disclosure or a device including a processor and a non-transitory computer-readable storage medium. FIG. 10 is a block diagram schematically showing a device 1000 consistent with embodiments of the present disclosure. The device 1000 includes a processor 1002 and a memory 1004 coupled to the processor 1002. The memory 1004 may be a non-transitory computer-readable storage medium and stores instructions that, when executed by the processor 1002, cause the processor 1002 to perform a method consistent with embodiments of the present disclosure, such as one of the exemplary methods described above. The device 1000 further includes an input/output interface 1006 for facilitating communication between the device 1000 and an external component or device.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for increasing coding reliability, comprising:
generating a generator matrix for an extended polar code including:
 a standard polar code part having N bit-channels, including K information bit-channels and N–K frozen bit-channels, wherein:
  N equals $2^n$, n being a positive integer,
  K is a positive integer equal to or smaller than N, and
  the standard polar code part includes $2^{m-1}$ mother codes, m being an integer larger than 1; and
 an additional frozen part having q additional frozen bit-channels, q being a positive integer,
 wherein q information bit-channels among the K information bit-channels are subject to an m-stage re-polarization using the q additional frozen bit-channels;
receiving an input vector including K information bits and N+q–K frozen bits;
transforming, using the generator matrix, the input vector to an output vector including N+q encoded bits, the K information bits being allocated to the K information bit-channels, and the N+q–K frozen bits being allocated to the N–K frozen bit-channels and the q additional frozen bit-channels.

2. The method of claim 1, wherein generating the generator matrix includes generating a generator matrix in which:
each of the mother codes has at least one of the K information bit-channels,
q is equal to or larger than $2^{m-1}$, and
the q information bit-channels include at least one information bit-channel from each of the mother codes.

3. The method of claim 2, wherein generating the generator matrix includes constructing each of the mother codes according to at least one of mutual information, Bhattacharyya parameter, or probability of error, to determine at least one information bit-channel from each of the mother codes for repolarizing.

4. The method of claim 2, wherein generating the generator matrix includes:
for each of the mother codes:
 constructing the mother code to determine at least one information bit-channel; and
 determining at least one least reliable information bit-channel from the at least one information bit-channel; and
re-polarizing all of the least reliable information bit-channels from the mother codes using the q additional frozen bit-channels.

5. The method of claim 1, wherein generating the generator matrix includes generating a generator matrix including:
the standard polar code part having the N bit-channels, and
the additional frozen part having the q additional frozen bit-channels, q being a positive integer smaller than one half of N.

6. The method of claim 1, wherein generating the generator matrix includes generating a generator matrix in which:
the K information bit-channels are more reliable than other bit-channels of the N bit-channels, and
the q information bit-channels subject to the m-stage re-polarization are less reliable than other information bit-channels of the K information bit-channels.

7. The method of claim 1, further comprising:
transmitting the N+q encoded bits through N+q communication channels, each of the N+q encoded bits being transmitted through one of the N+q communication channels.

8. The method of claim 1, further comprising:
storing the N+q encoded bits in storage cells.

9. The method of claim 8, wherein:
the storage cells are single-level storage cells, and
storing the N+q encoded bits includes storing each of the N+q encoded bits in one of N+q single-level storage cells.

10. The method of claim 8, wherein:
the storage cells are multi-level storage cells, each of which includes at least two storage levels, and
storing the N+q encoded bits includes storing each of the N+q encoded bits in one of the at least two storage levels of one of the multi-level storage cells.

11. A device for increasing coding reliability, comprising:
a processor; and
a non-transitory computer-readable storage medium storing instructions that, when executed by the processor, cause the processor to:
generate a generator matrix for an extended polar code including:
a standard polar code part having N bit-channels, including K information bit-channels and N−K frozen bit-channels, wherein:
N equals $2^n$, n being a positive integer,
K is a positive integer equal to or smaller than N, and
the standard polar code part includes $2^{m-1}$ mother codes, m being an integer larger than 1; and
an additional frozen part having q additional frozen bit-channels, q being a positive integer,
wherein q information bit-channels among the K information bit-channels are subject to an m-stage re-polarization using the q additional frozen bit-channels;
receive an input vector including K information bits and N+q−K frozen bits;
transform, using the generator matrix, the input vector matrix to an output vector including N+q encoded bits, the K information bits being allocated to the K information bit-channels, and the N+q−K frozen bits being allocated to the N−K frozen bit-channels and the q additional frozen bit-channels.

* * * * *